(12) United States Patent
Morohashi et al.

(10) Patent No.: US 9,124,151 B2
(45) Date of Patent: Sep. 1, 2015

(54) DRIVING APPARATUS, EXPOSURE APPARATUS, AND METHOD OF MANUFACTURING ARTICLE

(71) Applicant: CANON KABUSHIKI KAISHA, Tokyo (JP)

(72) Inventors: Akira Morohashi, Utsunomiya (JP); Nobushige Korenaga, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 132 days.

(21) Appl. No.: 13/803,389

(22) Filed: Mar. 14, 2013

(65) Prior Publication Data

US 2013/0271743 A1 Oct. 17, 2013

(30) Foreign Application Priority Data

Apr. 16, 2012 (JP) ................................. 2012-093396

(51) Int. Cl.
| | |
|---|---|
| G03B 27/58 | (2006.01) |
| H02K 7/14 | (2006.01) |
| G03B 7/20 | (2006.01) |
| G03F 7/20 | (2006.01) |
| F16H 25/24 | (2006.01) |

(52) U.S. Cl.
CPC .............. *H02K 7/14* (2013.01); *F16H 25/2418* (2013.01); *G03B 7/20* (2013.01); *G03B 27/581* (2013.01); *G03F 7/70758* (2013.01)

(58) Field of Classification Search
CPC ............................... G03F 7/70758; G03F 7/20
USPC ....................... 355/53, 72–76; 310/10, 12, 83
See application file for complete search history.

(56) References Cited

U.S. PATENT DOCUMENTS

| 6,259,509 | B1* | 7/2001 | Miwa et al. ...................... 355/53 |
|---|---|---|---|
| 2002/0109427 | A1* | 8/2002 | Hochhalter et al. ............ 310/89 |
| 2009/0044508 | A1* | 2/2009 | Labbe et al. .................... 56/252 |
| 2010/0174411 | A1* | 7/2010 | Park, IV ........................ 700/275 |

FOREIGN PATENT DOCUMENTS

| JP | 2001-300832 A | 10/2001 |
|---|---|---|
| JP | 2007-232130 A | 9/2007 |

* cited by examiner

*Primary Examiner* — Hung Henry Nguyen
(74) *Attorney, Agent, or Firm* — Rossi, Kimms & McDowell LLP

(57) ABSTRACT

The present invention provides a driving apparatus including an axis member supported on a base, and a movable member movable along the axis member, comprising a plurality of plate members each including a through-hole through which the axis member penetrates and surrounding the axis member, wherein the plurality of plate members are located apart from each other in a moving direction of the movable member.

12 Claims, 6 Drawing Sheets

DRIVING APPARATUS, EXPOSURE APPARATUS, AND METHOD OF MANUFACTURING ARTICLE

BACKGROUND OF THE INVENTION

1. Field of the Invention

The present invention relates to a driving apparatus, an exposure apparatus, and a method of manufacturing article.

2. Description of the Related Art

An exposure apparatus used to manufacture a semiconductor device or the like is required to have an accurate microfabrication technique as the microfabrication or integration level of a circuit pattern of a semiconductor integrated circuit rises. Such an exposure apparatus includes a driving apparatus for driving a substrate stage on which a substrate is held.

The driving apparatus generally includes an axis member supported on a base and a movable member threadedly engaging with the axis member. The substrate stage is supported on the movable member. Such a driving apparatus rotates the axis member to slide the movable member along the axis of the axis member, and drives the substrate stage by sliding the movable member. In this driving apparatus, however, when the movable member slides, the movable member and the axis member rub against each other, and particles are generated from the rubbing portions. When the generated particles scatter out of the driving apparatus and adhere to the substrate or mask, pattern defects, yield degradation, and the like occur and impede accurate microfabrication in the exposure apparatus. Japanese Patent Laid-Open Nos. 2001-300832 and 2007-232130 disclose techniques of preventing the scatter of particles. For example, Japanese Patent Laid-Open No. 2001-300832 discloses covering the axis member with an extendible dustproof cover. Japanese Patent Laid-Open No. 2007-232130 discloses attaching tubular covers to the two ends of the movable member.

However, when the axis member is covered with the extendible dustproof cover, the dustproof cover itself generates particles when it extends or contracts. When tubular covers are attached to the two ends of the movable member, the particles scatter from the opening portions of the tubular covers depending on the scatter direction of the particles. That is, the related arts do not have a sufficient effect of preventing the scatter of particles.

SUMMARY OF THE INVENTION

The present invention provides an advantageous technique for preventing scatter of particles in a driving apparatus.

According to one aspect of the present invention, there is provided a driving apparatus including an axis member supported on a base, and a movable member movable along the axis member, comprising: a plurality of plate members each including a through-hole through which the axis member penetrates and surrounding the axis member, wherein the plurality of plate members are located apart from each other in a moving direction of the movable member.

Further aspects of the present invention will become apparent from the following description of exemplary embodiments with reference to the attached drawings.

DESCRIPTION OF THE EMBODIMENTS

Figure 1:
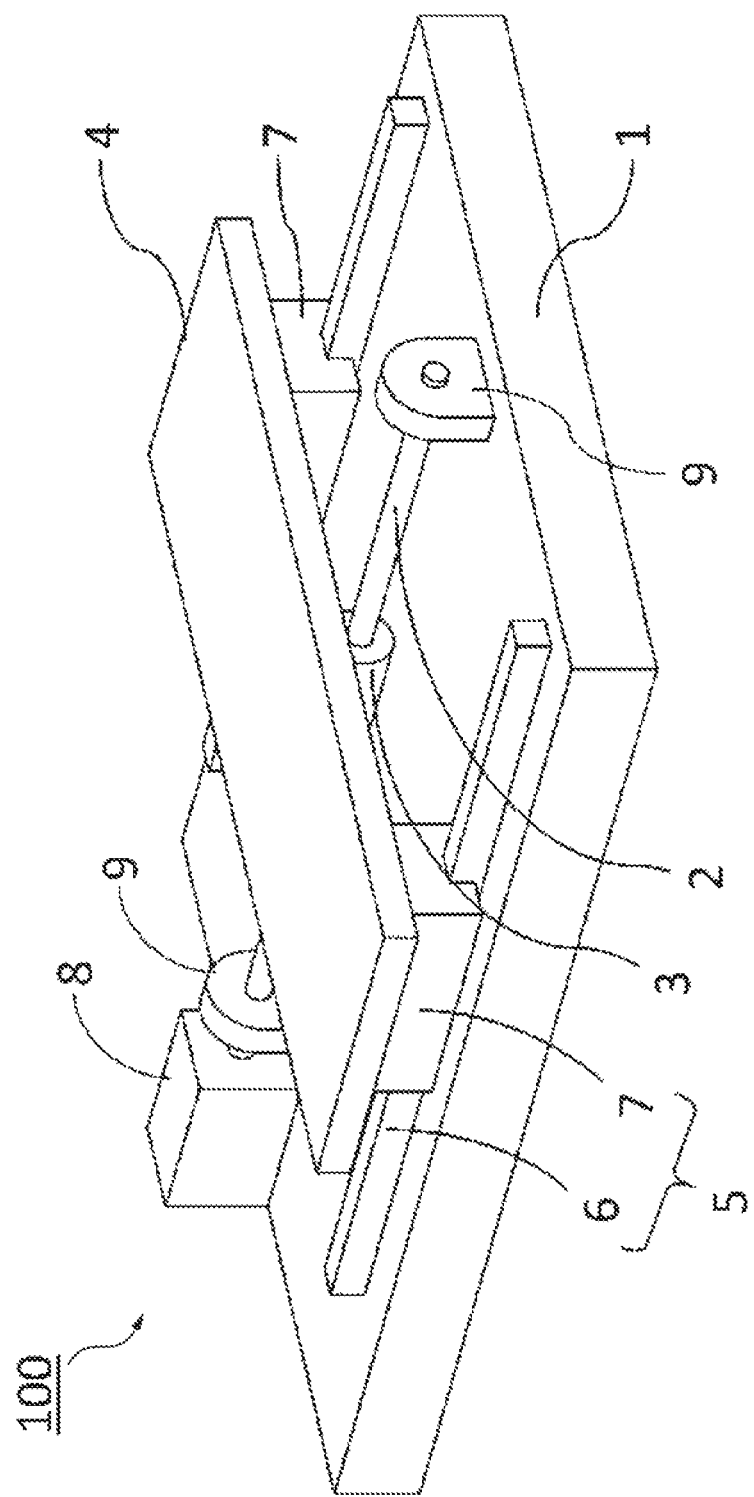
FIG. 1 is a perspective view showing a driving apparatus according to the first embodiment of the present invention.

Exemplary embodiments of the present invention will be described below with reference to the accompanying drawings. Note that the same reference numerals denote the same members throughout the drawings, and a repetitive description thereof will not be given.

First Embodiment

Figure 2:
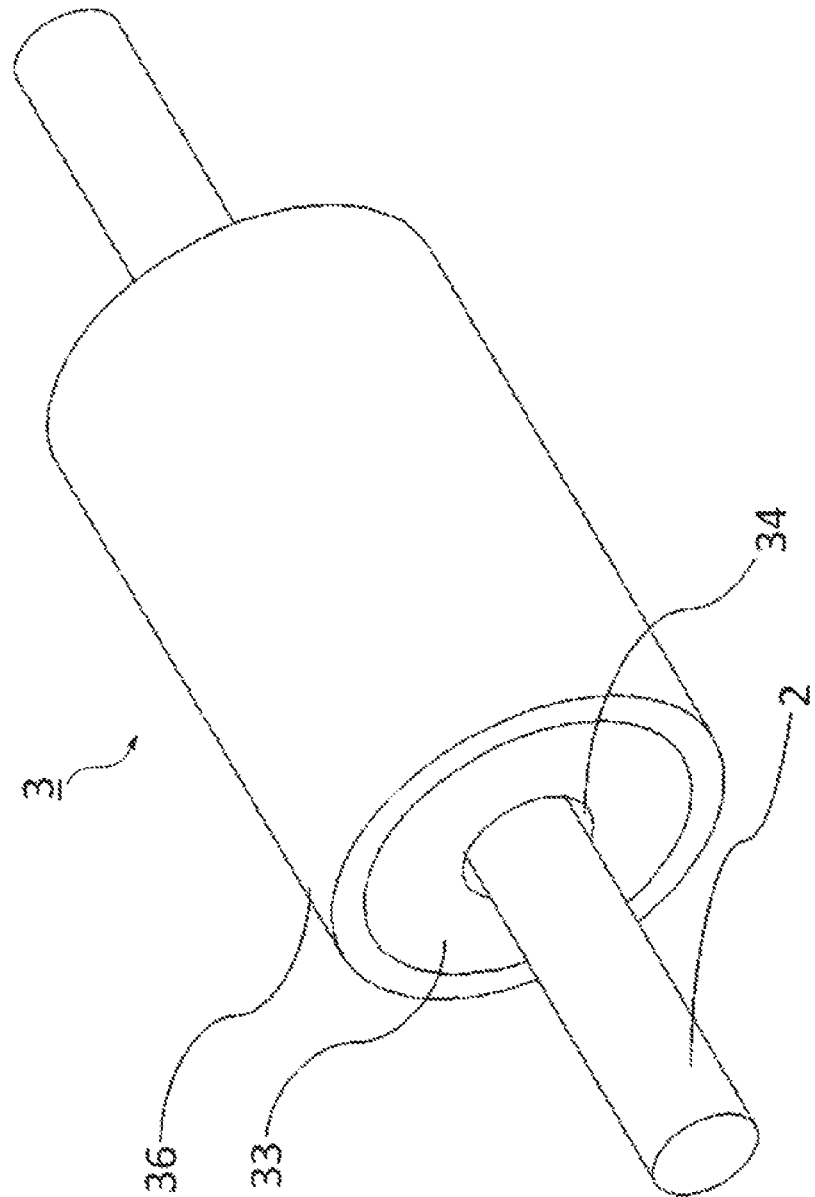
FIG. 2 is a perspective view showing a movable unit.

A driving apparatus 100 according to the first embodiment of the present invention will be described with reference to FIGS. 1 and 2. FIG. 1 is a perspective view showing the driving apparatus 100 according to the first embodiment of the present invention. FIG. 2 is a perspective view showing a movable unit 3 included in the driving apparatus 100 according to the first embodiment. The driving apparatus 100 includes a base 1, an axis member 2, the movable unit 3, and a substrate stage 4. The driving apparatus 100 also includes a guide apparatus 5 that guides driving of the substrate stage 4, and a motor 8 that rotates the axis member 2.

The axis member 2 is a screw axis formed into a rod shape. A groove is spirally formed in the side surface of the axis member 2. The axis member 2 is rotatably supported at its two ends by supporters 9 fixed on the base 1. One end of the axis member 2 is connected to the motor 8. For this reason, when a signal is supplied to the motor 8 to drive it, the axis member 2 rotates about the rotation axis.

The movable unit 3 includes a movable member 30 and a cover unit 32. The axis member 2 penetrates the movable unit 3, as shown in FIG. 2. The movable member 30 converts the rotate motion of the axis member 2 into a linear motion so that the movable unit 3 slides in the axial direction of the axis member 2, as will be described later. The substrate stage 4 is supported on the movable unit 3. When the movable unit 3 slides in the axial direction of the axis member 2, the substrate stage 4 moves in the axial direction of the axis member 2 together with the movable unit 3.

Figure 3:
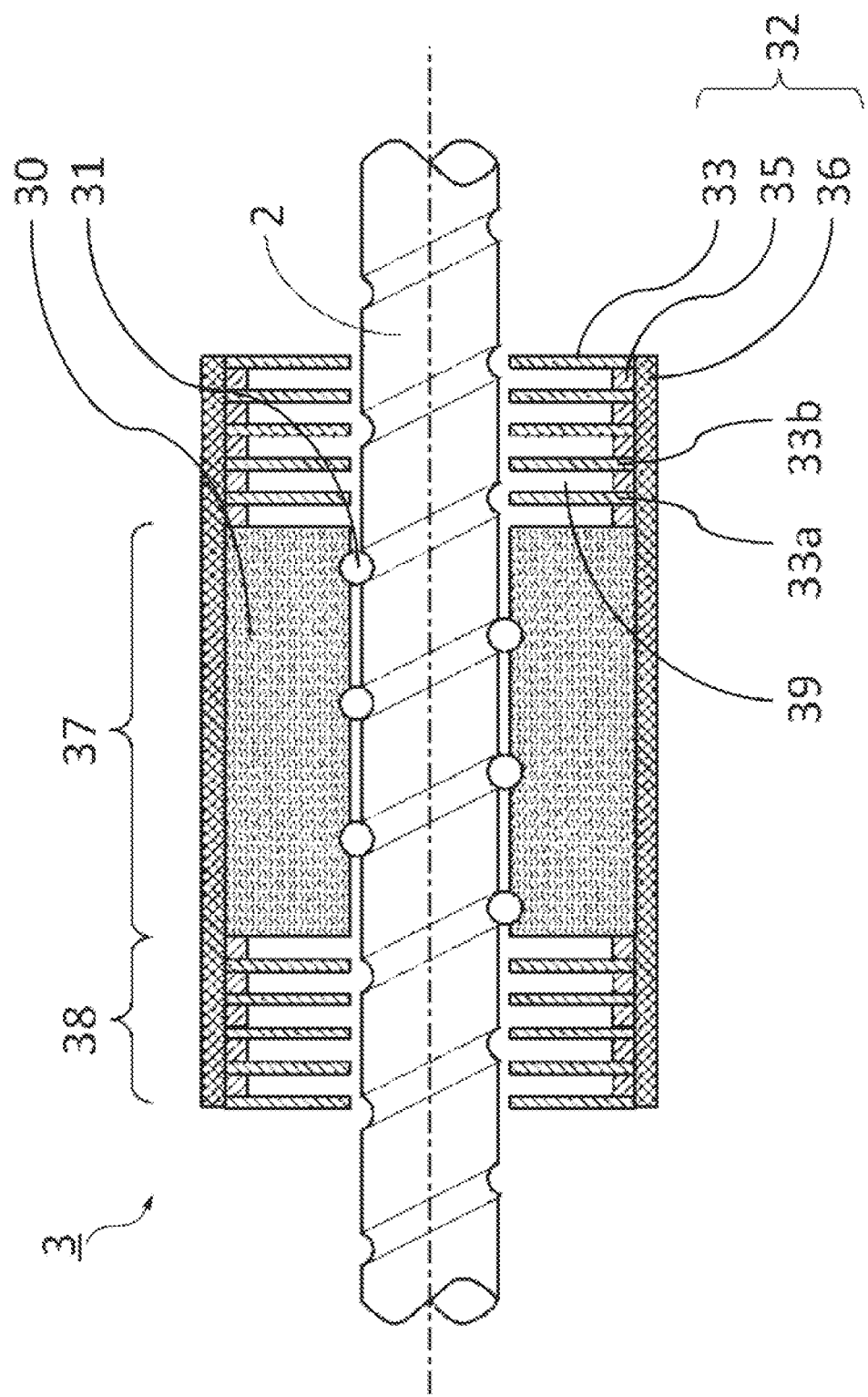
FIG. 3 is a sectional view showing the movable unit.

The movable unit 3 of the driving apparatus 100 according to the first embodiment will be described here with reference to FIG. 3. FIG. 3 is a sectional view showing the movable unit 3 of the driving apparatus 100 according to the first embodiment. As described above, the movable unit 3 includes the movable member 30 and the cover unit 32. The movable member 30 is configured to be movable along the axis of the axis member 2. More specifically, the movable member 30 is a nut member formed into a cylindrical shape and threadedly engages with the axis member 2 that penetrates the center of the movable member 30. A groove having the same interval as that of the groove of the axis member 2 is formed in the inner surface of the movable member 30. Rolling elements 31 are provided between the groove of the movable member 30 and that of the axis member 2. The rolling elements 31 allow the movable member 30 to smoothly slide along the rotation axis of the axis member 2 when the axis member 2 rotates. However, even if the rolling elements 31 cause the movable member 30 to smoothly slide in the axial direction of the axis member 2, rubbing between the axis member 2, the movable member 30, and the rolling elements 31 cannot be prevented, and a particle 10 is generated from the rubbing portions. When the generated particle 10 scatters out of the driving apparatus 100 and enters, for example, an exposure apparatus including the driving apparatus 100, pattern defects, yield degradation, and the like occur and impede accurate microfabrication in the exposure apparatus. The movable unit 3 of the driving apparatus 100 according to this embodiment includes the cover unit 32 to prevent the scatter of the particle 10.

The cover unit 32 includes a cover member 36, a plurality of plate members 33, and a plurality of spacers 35. The cover member 36 includes a connection portion 37 that surrounds the movable member 30 and is connected to the movable member 30, and elongated portions 38 that are elongated from the connection portion 37 in the moving direction of the movable member 30 and surround the axis member 2. The connection portion 37 of the cover member 36 need only connect the elongated portions 38 to the movable member 30 and may therefore be configured to surround only part of the movable member 30. If the elongated portion 38 can directly be connected to the movable member 30, the cover member 36 may include only the elongated portion 38 without the connection portion 37.

Each plate member 33 has, at its center, a through-hole 34 to make the axis member 2 penetrate, as shown in FIG. 2. The diameter of the through-hole 34 formed in the plate member 33 is set to be slightly larger than the outer diameter of the axis member 2. The plate member 33 is configured to be connected to the elongated portion 38 of the cover member 36 and extended from the portion connected to the elongated portion 38 toward the through-hole 34, and surround the axis member 2 at its end on the side of the through-hole 34 (the side of the axis member 2). A plurality of plate members 33 are used. The plurality of plate members 33 are located apart from each other in the moving direction of the movable member 30.

The spacers 35 have the same outer diameter as that of the plate members 33 and are inserted between the plurality of plate members 33 located apart from each other in the moving direction of the movable member 30 (to be referred to as gaps 39 between the plurality of plate members 33 hereinafter). More specifically, each spacer 35 is inserted in the gap between two adjacent plate members, that is, a first plate member 33a and a second plate member 33b out of the plurality of plate members 33 so as to maintain the interval between the first plate member 33a and the second plate member 33b to a predetermined value (pitch p). Like the plate member 33, each spacer 35 has, at its center, a through-hole to make the axis member 2 penetrate. The diameter of the through-hole formed in the spacer 35 is set to be larger than that of the through-hole 34 formed in the plate member 33.

As described above, when the plurality of plate members 33 and the plurality of spacers 35 are alternately stacked to form a multistage structure, the gaps 39 between the plurality of plate members 33 become almost closed spaces by the axis member 2. The driving apparatus 100 according to the first embodiment uses both the spacers 35 and the cover member 36. However, if the gaps 39 between the plurality of plate members 33 can be maintained to the predetermined value by the cover member 36, the spacers 35 need not always be used. In addition, if the plurality of plate members 33 can be fixed to the movable member 30 by the spacers 35, the driving apparatus 100 according to the first embodiment need not always use the cover member 36.

The guide apparatus 5 is provided to guide the movement of the substrate stage 4 to prevent it from making a rotation such as pitching or yawing, and is formed from track members 6 and moving members 7. The track members 6 are located on both sides of the axis member 2 in parallel to its axial direction within the sliding range of the moving members 7, that is, within the moving range of the movable unit 3. The moving members 7 support the substrate stage 4. The moving members 7 slide on the track members 6 when the movable unit 3 moves along the axis of the axis member 2.

As described above, the driving apparatus 100 including the cover unit 32 prevents the particle 10 generated when the movable member 30 slides against the axis member 2 from scattering out of the driving apparatus 100. The effect of the cover unit 32 to prevent the scatter of the particle 10 will be explained with reference to FIGS. 4A and 4B.

Figure 4A:
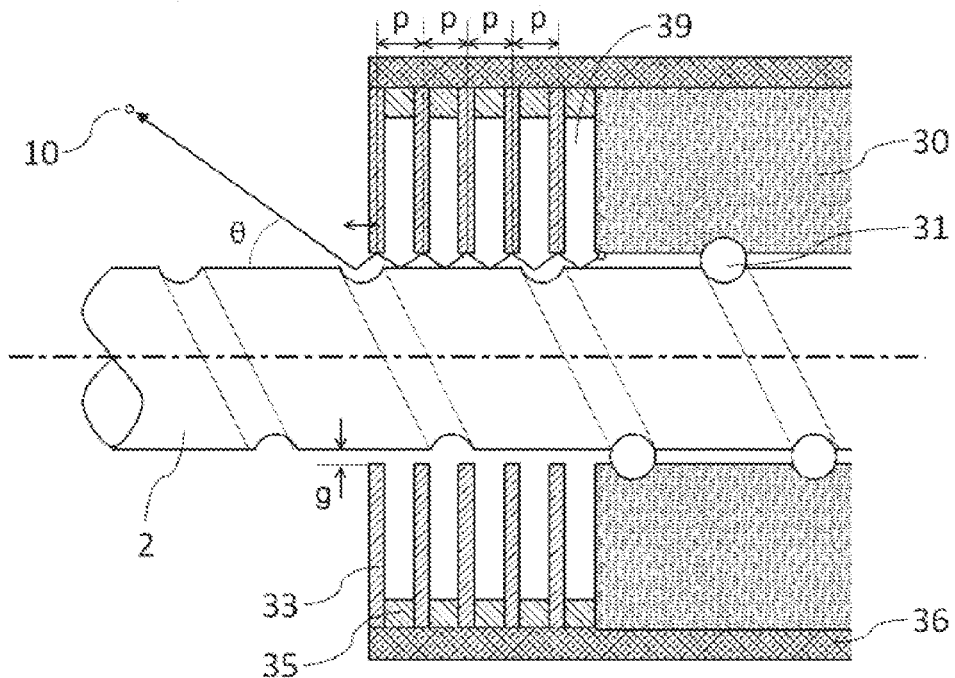
FIG. 4A is a sectional view showing a state in which a particle scatters from a cover unit.
Figure 4B:
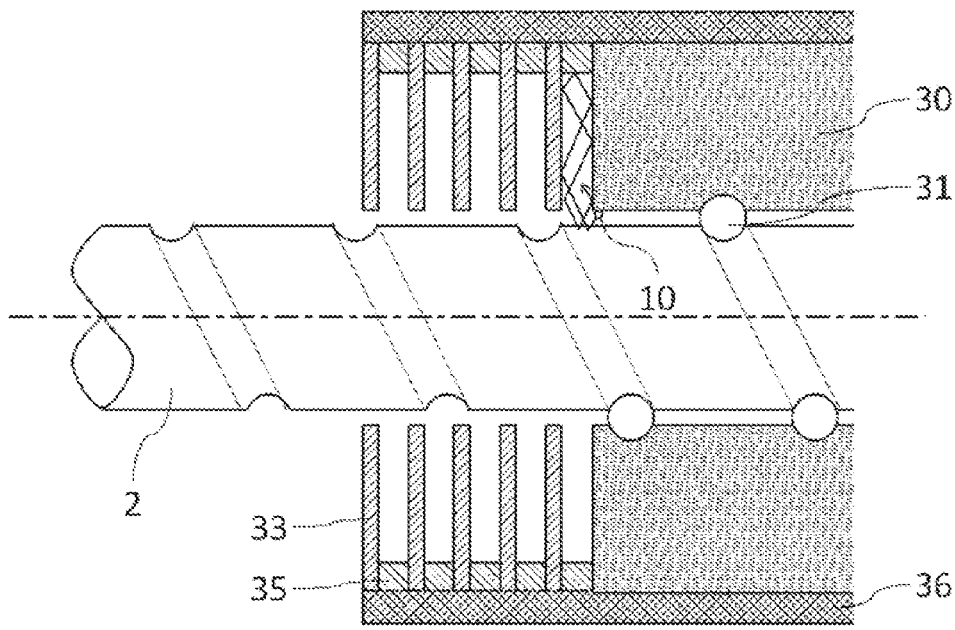
FIG. 4B is a sectional view showing a state in which the particle is trapped by the cover unit.

FIG. 4A is a sectional view showing a state in which the particle 10 generated between the axis member 2 and the movable member 30 scatters out of the cover unit 32. If an incident angle θ of the particle 10 satisfies tan θ=2g/p, the particle 10 scatters out of the cover unit 32 while being repetitively reflected between the axis member 2 and the ends of the plurality of plate members 33. In this case, p is the interval (pitch) of the plurality of plate members 33, and g is the gap between the axis member 2 and the end of the plate member 33 on the side of the axis member 2. However, the particle 10 that satisfies the condition is rarely generated. In most cases, the particle 10 enters the gap 39 between the plurality of plate members 33, as shown in FIG. 4B. FIG. 4B is a sectional view showing a state in which the particle 10 generated between the axis member 2 and the movable member 30 enters the gap 39 between the plurality of plate members 33. The particle 10 that has entered the gap 39 is repetitively reflected many times by the plurality of plate members 33 (including the movable member 30) and spacers 35. Hence, the kinetic energy of the particle 10 is gradually attenuated. As a result, the particle 10 is trapped by the plurality of plate members 33 or spacers 35 and rarely scatters out of the movable unit 3.

To further reduce the scatter of the particle 10 generated between the axis member 2 and the movable member 30 out of the movable unit 3, the gap g between the axis member 2 and the end of the plate member 33 on the side of the axis member 2 is made smaller. This allows only the particle 10 having the small incident angle θ to pass through the gap g and enables to more effectively prevent the particle 10 from scattering. In addition, to attenuate the kinetic energy of the particle 10 by increasing the number of times of reflection of the particle 10 by the plate members 33 or the spacers 35, the gap g is made smaller, and at the same time, the diameter of the through-hole formed in the spacer 35 is made larger. That is, the aspect ratio of the space defined by the plurality of plate members 33 and spacers 35 and the axis member 2 is made higher. When the aspect ratio of the space defined by the plurality of plate members 33 and spacers 35 and the axis member 2 is higher, the particle that has entered the space can more effectively be prevented from passing through the gap g between the axis member 2 and the end of the plate member 33 and scattering out of the cover unit 32. Note that the larger the number of plate members 33 by the cover unit 32 is, and the larger the outer diameter of the plate members 33 is, the larger the effect of preventing the scatter of the particle 10 can be. However, the movable unit 3 becomes bulky. To prevent this, the number and outer diameter of the plate members 33 are set in consideration of the size of the movable unit 3. In addition, the cover unit 32 including the plurality of plate members 33 and spacers 35 and the cover member 36 can be manufactured as one component by machining or the like.

As described above, in the driving apparatus 100 according to the first embodiment, the particle 10 generated between the axis member 2 and the movable member 30 can be moved into the gap 39 between the plurality of plate members 33 and trapped by the plurality of plate members 33 or spacers 35. Hence, the driving apparatus 100 according to the first embodiment can greatly reduce the scatter of the particle 10 out of the driving apparatus 100.

Second Embodiment

Figure 5:
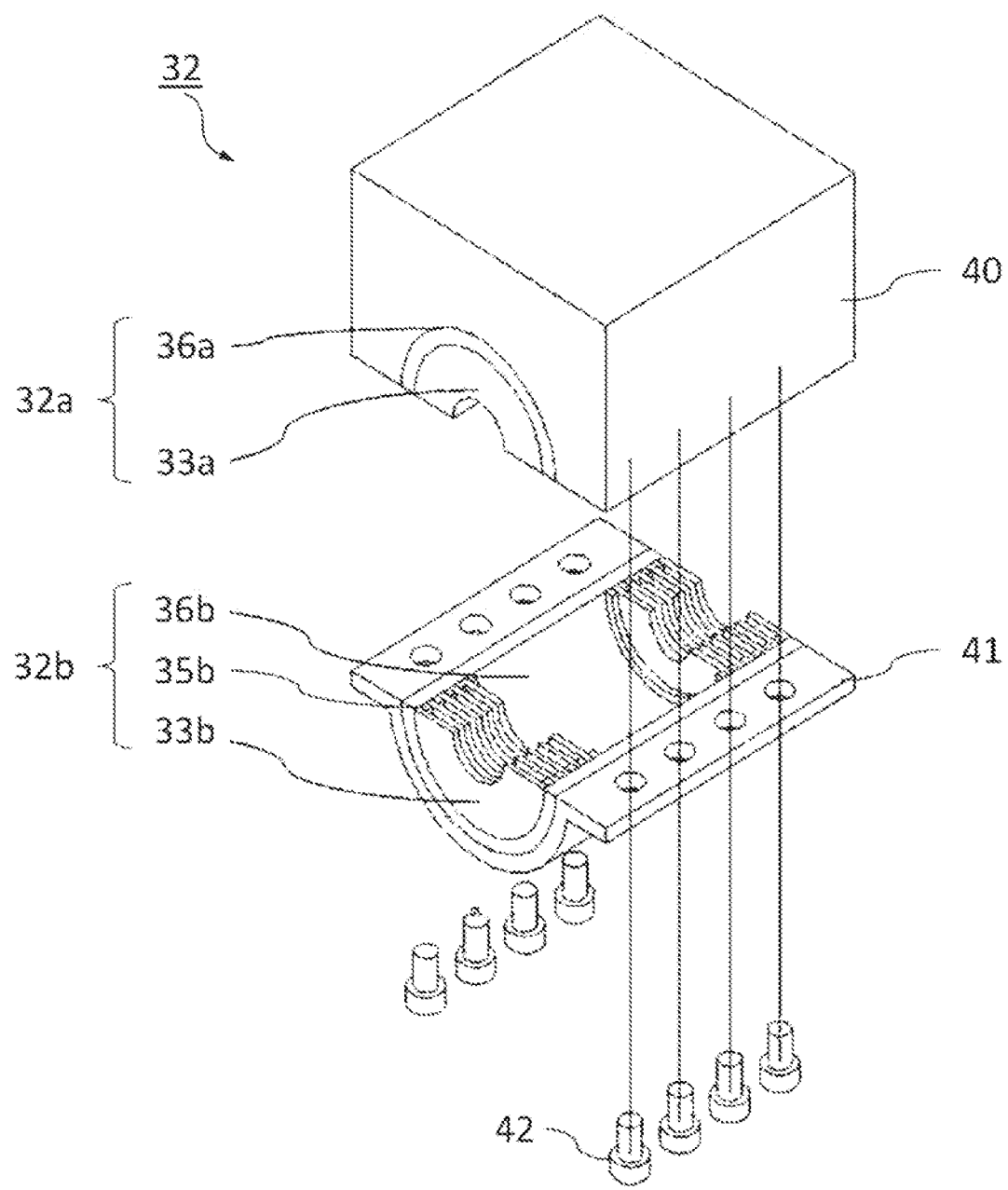
FIG. 5 is a perspective view showing a movable unit in a driving apparatus according to the second embodiment of the present invention.

A cover unit 32 of a driving apparatus according to the second embodiment of the present invention will be described with reference to FIG. 5. The cover unit 32 according to the second embodiment includes a plurality of plate members 33, a plurality of spacers 35, and a cover member 36, as in the driving apparatus 100 of the first embodiment. The cover unit 32 according to the second embodiment is divided in the vertical direction perpendicular to the axial direction of an axis member 2. That is, the plurality of plate members 33, the plurality of spacers 35, and the cover member 36 are divided in the vertical direction perpendicular to the axial direction of the axis member 2. The cover unit 32 of the second embodiment can be divided in the vertical direction perpendicular to the axial direction of the axis member 2, and can therefore easily be attached to the axis member or detached from the axis member. The cover unit 32 of the driving apparatus according to the second embodiment is divided into two parts in the vertical direction. However, the direction is not limited to the vertical direction. The cover unit may be divided into a plurality of parts in the direction perpendicular to the axial direction of the axis member 2.

Out of the divided cover units 32, a cover unit 32a on the upper side (the side of a substrate stage 4) is integrated with a support member 40 that supports the substrate stage 4. Out of the divided cover units 32, a cover unit 32b on the lower side (the side of a base 1) is integrated with a fixed member 41. When the fixed member 41 is fixed to the support member 40 by screws 42, the upper cover unit 32a and the lower cover unit 32b couple and function as the cover unit 32 that is the same as in the first embodiment.

When the cover unit 32 having the above-described arrangement is incorporated in the driving apparatus, the upper cover unit 32a and the lower cover unit 32b are coupled so as to locate a movable member 30 at the center of the cover unit 32 and sandwich the axis member 2 and the movable member 30. In the driving apparatus according to the second embodiment, the plurality of plate members 33 or spacers 35 can trap a particle 10 generated between the axis member 2 and the movable member 30, as in the driving apparatus 100 of the first embodiment. It is therefore possible to greatly reduce the scatter of the particle 10 out of the driving apparatus 100. Additionally, in the driving apparatus of the second embodiment, the cover unit 32 is divided. For this reason, the cover unit 32 can easily be attached to the axis member 2 or detached from the axis member 2.

Embodiment of Exposure Apparatus

Figure 6:
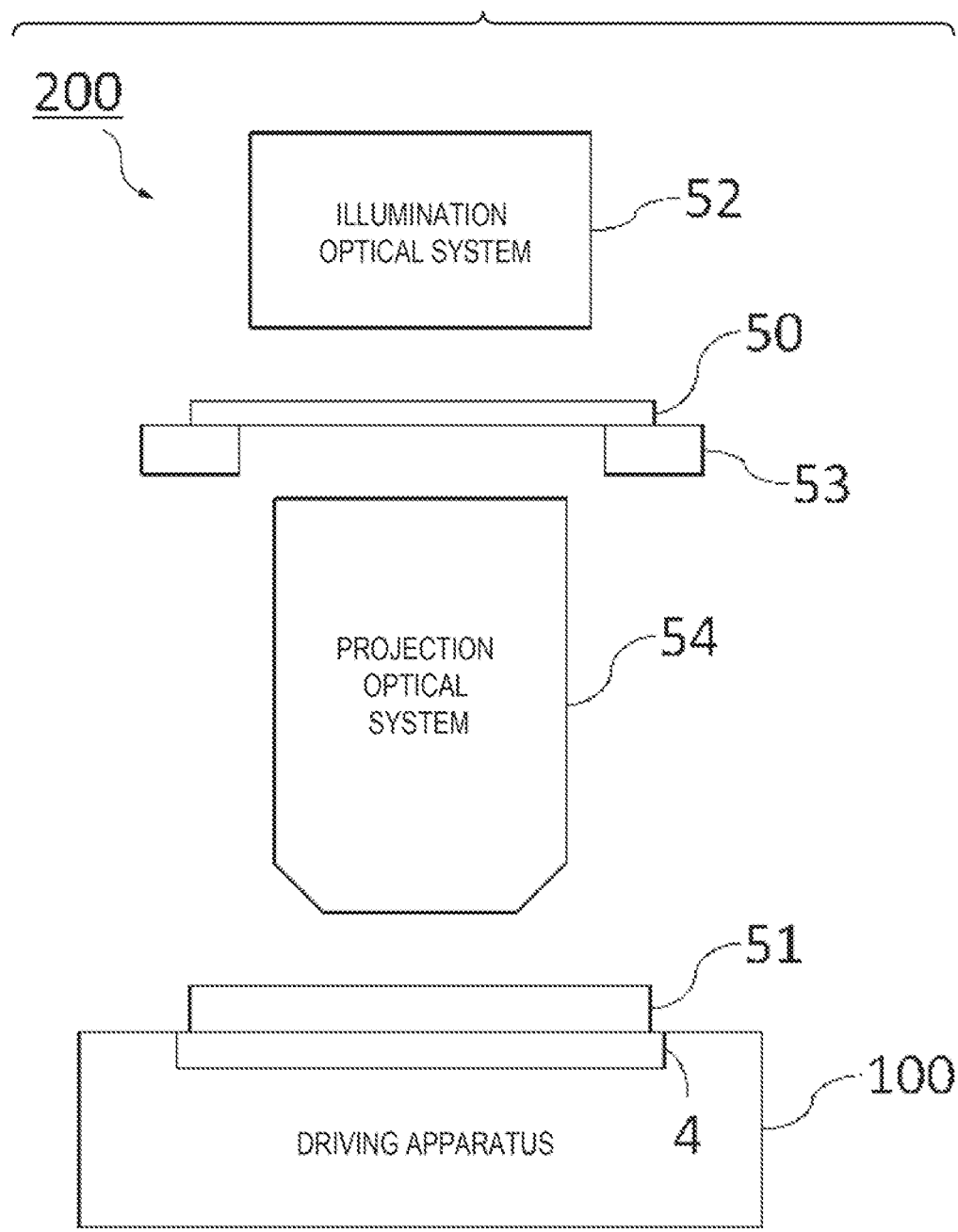
FIG. 6 is a view showing an exposure apparatus according to an embodiment of the present invention.

An exposure apparatus 200 including a driving apparatus according to the embodiment of the present invention will be described with reference to FIG. 6. FIG. 6 is a schematic view showing the arrangement of the exposure apparatus 200 according to the present invention. The exposure apparatus 200 of the present invention is configured to project the pattern of a mask 50 onto a substrate 51 (for example, glass substrate or semiconductor substrate) and expose the substrate. The exposure apparatus 200 includes an illumination optical system 52 that irradiates the mask 50 with light, a mask stage 53 that holds the mask 50, a substrate stage 4 that holds the substrate 51, a projection optical system 54 that projects the pattern of the mask 50 onto the substrate 51, and a driving apparatus 100. The driving apparatus 100 is configured to support the substrate stage 4 on a movable member 30.

In the exposure apparatus 200 having the above-described arrangement, the scatter of particles out of the driving apparatus 100 is reduced, as described above. Hence, the exposure apparatus 200 can reduce adhesion of particles to the substrate or the mask at the time of exposure and suppress pattern defects, yield degradation, and the like. In other words, the exposure apparatus 200 can implement accurate microfabrication.

Embodiment of Method of Manufacturing Article

A method of manufacturing article according to an embodiment of the present invention is suitable for manufacturing an article, for example, a micro device such as a semiconductor device or an element having a microstructure. The method of manufacturing an article according to this embodiment includes a step of forming a latent image pattern on a photoresist applied to a substrate using the above-described exposure apparatus (step of exposing a substrate), and a step of developing the substrate on which the latent image pattern has been formed in that step. This manufacturing method further includes other known steps (oxidation, deposition, evaporation, doping, planarization, etching, resist peeling, dicing, bonding, packaging, and the like). The method of manufacturing an article according to this embodiment is advantageous in at least one of the performance, quality, productivity, and production cost of an article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-093396 filed on Apr. 16, 2012, which is hereby incorporated by reference herein in its entirety.

What is claimed is:

1. A driving apparatus comprising:
an axis member;
a movable member movable along an axial direction of the axis member and engaged with the axis member; and
a cover unit connected to the movable member and movable together with the movable member, and includes:
a cover member that covers a portion of the axis member;
a plurality of plate members each including a through-hole through which the axis member penetrates,
wherein the plurality of plate members are located spaced apart from each other in a moving direction of the movable member; and
spacer that maintains gaps between the plurality of plate members,
wherein the spacer is disposed so that a gap between the axis member and the spacer is greater than a gap between the axis member and the plurality of plate members.

2. The apparatus according to claim 1, wherein the cover member includes a connection portion connected to the movable member and an elongated portion that extends from the connection portion along the moving direction of the movable member and surrounds the plurality of plate.

3. The apparatus according to claim 1, wherein the spacer is disposed between each adjacent plate members, among the plurality of plate members.

4. The apparatus according to claim 1, wherein the cover unit is divided into a plurality of parts in a direction perpendicular to the axial direction of the axis member.

5. An exposure apparatus for exposing a substrate, the exposure apparatus comprising:
   a substrate stage configured to hold the substrate; and
   a driving apparatus configured to drive the substrate stage, wherein the driving apparatus includes:
      an axis member;
      a movable member movable along an axial direction of the axis member and engaged with the axis member; and
      a cover unit connected to the movable member and movable together with the movable member, and includes:
         a cover member that covers a portion of the axis member;
         a plurality of plate members each including a through-hole through which the axis member penetrates,
            wherein the plurality of plate members are spaced apart from each other in a moving direction of the movable member; and
         a spacer that maintains gaps between the plurality of plate members,
            wherein the spacer is disposed so that a gap between the axis member and the spacer is greater than a gap between the axis member and the plurality of plate members.

6. A method of manufacturing an article, the method comprising the steps of:
   exposing a substrate using an exposure apparatus for exposing a substrate;
   developing the exposed substrate; and
   processing the developed substrate to manufacture the article,
   wherein the exposure apparatus includes:
      a substrate stage configured to hold the substrate; and
      a driving apparatus configured to drive the substrate stage,
      wherein the driving apparatus includes:
         an axis member;
         a movable member movable along an axial direction of the axis member and engaged with the axis member; and
         a cover unit connected to the movable member and movable together with the movable member, and includes:
            a cover member that covers a portion of the axis member,
            a plurality of plate members each including a through-hole through which the axis member penetrates,
               wherein the plurality of plate members are spaced apart from each other in a moving direction of the movable member,
            a spacer that maintains gaps between the plurality of plate members,
               wherein the spacer is disposed so that a gap between the axis member and the spacer is greater than a gap between the axis member and the plurality of plate members.

7. The apparatus according to claim 1, wherein the movable member moves along a rotation axis of the axis member by rotation of the axis member.

8. The apparatus according to claim 1, wherein the spacer includes a through-hole through which the axis member penetrate.

9. The apparatus according to claim 1, wherein the plurality of plate members are disposed at an end of the movable member in the moving direction of the movable member.

10. A driving apparatus comprising:
    an axis member;
    a movable member movable along an axial direction and engaged with the axis member; and
    a cover unit connected to the movable member, movable together with the movable member, and includes a portion that covers a portion of the axis member,
    wherein the portion of the cover unit includes:
       a plurality of plate members each including a through-hole through which the axis member penetrates, and located spaced apart from each other in a moving direction of the movable member; and
       a gap maintaining portion that maintains gaps between the plurality of plate members, and is configured so that a gap between the axis member and the gap maintaining portion is longer than a gap between the axis member and the plurality of plate members.

11. The apparatus according to claim 10, wherein the gap maintaining portion has a cover member including a connection portion connected to the movable member and an elongated portion elongated from the connection portion in the moving direction and surrounding the plurality of plate members.

12. The apparatus according to claim 10, wherein the plurality of plate members and the gap maintaining portion are made of a single component.

* * * * *